US 6,737,606 B2

(12) United States Patent
Peng et al.

(10) Patent No.: US 6,737,606 B2
(45) Date of Patent: May 18, 2004

(54) WAFER DICING DEVICE AND METHOD

(75) Inventors: Neo Chee Peng, Singapore (SG); Kian Shing Tan, Singapore (SG); Chew Beng Chye, Singapore (SG); Tan Hock Chuan, Singapore (SG); Fong Chun Wai, Singapore (SG)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/118,666

(22) Filed: Jul. 9, 2002

(65) Prior Publication Data

US 2003/0047543 A1 Mar. 13, 2003

(30) Foreign Application Priority Data

Sep. 10, 2001 (SG) .................................. 200105517-7

(51) Int. Cl.[7] .............................................. B23K 26/38
(52) U.S. Cl. .................................................. 219/121.68
(58) Field of Search ...................... 219/121.6, 121.67, 219/121.68, 121.69, 121.72, 121.82, 121.84, 121.85

(56) References Cited

U.S. PATENT DOCUMENTS

| | | | |
|---|---|---|---|
| 4,355,457 A | 10/1982 | Barlett et al. ............... 29/583 |
| 4,610,079 A | 9/1986 | Abe et al. .................... 29/583 |
| 5,091,331 A | 2/1992 | Delgado et al. ............. 437/62 |
| 5,302,554 A | 4/1994 | Kashiwa et al. ............ 437/227 |
| 5,356,081 A | 10/1994 | Sellar ............................ 241/1 |
| 5,543,365 A | 8/1996 | Wills et al. .................. 437/226 |
| 5,552,345 A | 9/1996 | Schrantz et al. ............ 437/227 |
| 5,902,499 A | 5/1999 | Richerzhagen .......... 219/121.84 |
| 5,904,546 A | 5/1999 | Wood et al. ................. 438/460 |
| 6,427,676 B2 | 8/2002 | Akram et al. ............. 125/23.01 |
| 6,555,294 B1 * | 4/2003 | Albertini et al. |

FOREIGN PATENT DOCUMENTS

| | | | |
|---|---|---|---|
| CA | 2330426 | 11/1998 | ........... B23K/26/14 |
| EP | 0818818 | 1/1998 | ........... H01L/21/78 |
| JP | 58-036939 | 3/1983 | |
| WO | WO-99/56907 | 11/1999 | ........... B23K/26/14 |
| WO | WO-00/75983 | 12/2000 | ........ H01L/21/784 |
| WO | WO-01/75966 | 10/2001 | ........... H01L/21/78 |

* cited by examiner

Primary Examiner—Samuel M. Heinrich
(74) Attorney, Agent, or Firm—Schwegman, Lundberg, Woessner & Kluth, P.A.

(57) ABSTRACT

Methods and devices for cutting workpieces, which include a laser adapted to at least partially cut a workpiece, are described. The workpiece is a wafer having a plurality dies each with an integrated circuit. A mechanical cutter follows the laser and engages the workpiece. An embodiment of the mechanical cutter includes a cutting blade adapted to complete a cut through a workpiece. A method includes a two-pass cutting procedure. The first pass is made by a laser, which scribes the workpiece. The second pass is made by the mechanical cutter. In an embodiment, the mechanical cutter follows the scribe created by the laser. In an embodiment, the workpiece is supported by a table. The workpiece moves relative to the laser and the mechanical cutter.

58 Claims, 6 Drawing Sheets

WAFER DICING DEVICE AND METHOD

This application claims priority under 35 U.S.C. 119 from Singapore Application No. 200105517-7 filed Sep. 10, 2001, which application is incorporated herein by reference.

TECHNICAL FIELD

The present invention relates generally to integrated circuit manufacturing equipment, and in particular to apparatus and methods for dicing wafers.

BACKGROUND

Wafers are fabricated with a plurality of dies each having a plurality of integrated circuit elements therein. A die represents one individual chip that must be separated from adjacent dies before packaging. Conventionally, dies are separated from each other and the rest of the wafer by a saw blade. With the existing dicing technology of using diamond-nickel blades, the backside cutting quality can be improved by performing a two-pass cut. However, this will reduce productivity by around 50% and a wider saw kerf is expected. This is due to machine accuracy for the second pass. The wider saw kerf hinders progress towards a smaller saw street and thus leading to a lower die per wafer count.

Another area of concern when separating the dies is chipping on the top surface of the dies or fragmentation on the bottom surface of the dies adjacent the saw street. It is believed that one the of possible causes for the top or bottom surface fragmentation detected after the dicing process is the presence of a passivation layer, test structures, and/or metal layers deposited on the saw street during various wafer fabrication processes. These materials are not removed during wafer fabrication due to the higher operational cost and cycle time required for such fabrication steps. The impact of these materials on the cutting quality can be seen in FIG. 1. The reason for this poor cutting quality is believed to be due to the clogging of the blade, which results in overloading of the blade during dicing.

It is believed that a two-pass cut process using a saw blade for each cut pass will not significantly improve topside chipping as compared to a single-pass cutting due to the presence of test structures and metal layers on the wafer. The cutting quality of a two-pass cut can be seen in FIG. 2. A comparison on the cutting quality obtained from a single-pass cut and a two-pass cut is shown in Table 1.

TABLE 1

| Cutting Quality Comparison | | |
|---|---|---|
| | 1-Pass Cut | 2-Pass Cut |
| Width (max) | 52.6 μm | 55.9 μm |
| Back Side Chipping | 105.2 μm | 43.9 μm |
| Back Side Cracking | 37.4 μm | 19.6 μm |

The numbers associated with the back side chipping and back side cracking represent the size, e.g., length or width, of such defects in microns. As shown in Table 1, the backside chipping and cracking improves approximately 40–50% using a two-pass cutting process. The top side chipping, for example, in its width, does not improve significantly in a two-pass cutting process.

While saw cutting of wafers is the conventional industry standard, there remains drawbacks with such cutting. Saw blades wear over time. This results in inconsistent cutting quality from when the blade is new and subsequent cutting operations. Consequently, the operator must predict when the blade has reached the end of its useful life. This can not be predicted accurately. Accordingly, the saw blades may be changed before the end of their useful lives resulting in higher equipment costs than necessary due to premature saw blade replacement. Moreover, saw blades introduce mechanical stresses in the workpiece while sawing, especially at the surfaces of the workpiece. Due to these stresses saw blades may not be used to cut very thin workpieces, such as ultrathin semiconductor wafers.

A recent development in wafer dicing is laser cutting. However, laser dicing of semiconductor wafers have failed to meet the rigid demands of industry. One significant drawback of using lasers is the collateral thermal damage to the chips caused by the laser. New lasers have been proposed to overcome the drawbacks of conventional lasers in the area of semiconductor dicing. An example of such a system is being promoted by Synova SA. of Lausanne, Switzerland, and described in WO 99/56907, titled "MATERIAL SHAPING DEVICE WITH A LASER BEAM WHICH IS INJECTED INTO A STREAM OF LIQUID", herein incorporated by reference. WO 99/56907 describes a method and device for shaping material of workpieces using a laser beam which is injected into a stream of liquid. The liquid, which is to be formed into a stream, is fed to the nozzle channel opening such that the liquid does not swirl, especially without flow components which are tangential to the nozzle channel axis. The laser irradiation is focused on a channel entry plane and the liquid is fed to the channel opening in such a way that a liquid retention space is avoided in a beam focusing ball and in the immediate surroundings thereof. Another laser cutting arrangement is described in U.S. Pat. No. 5,902,499, herein incorporated by reference. However, these laser cutting arrangements require a reduced speed when used to cut wafers. The feedspeed of the wafer is reduced to 40 mm/s and 20 mm/s for wafers with 305 μm and 470 μm thickness, respectively. This is due to the greater laser pulse energy required. Therefore, with this method, laser cuts can be achieved at the expense of productivity.

For the reasons stated above, for other reasons stated below, and for other reasons which will become apparent to those skilled in the art upon reading and understanding the present specification, there is a need in the art for improved integrated circuit manufacturing equipment and methods of manufacturing integrated circuits.

SUMMARY

The present invention is directed to methods and devices for cutting workpieces, which include a laser adapted to at least partially cut a workpiece. In an embodiment, the workpiece is a wafer having a plurality dies each with an integrated circuit. An embodiment of the present invention further includes a mechanical cutter following the laser and engaging the workpiece. An embodiment of the mechanical cutter includes a cutting blade adapted to complete a cut through a workpiece. An embodiment of the cutting blade includes a nickle-diamond cutting surface on a circular blade. An embodiment of the laser includes a liquid guided laser beam. An embodiment of the laser includes a yttrium-aluminum-garnet (YAG) laser.

In an embodiment, a process according to the present invention includes a two-pass cutting procedure. The first pass is made by a laser, which scribes the workpiece. The second pass is made by a mechanical cutter. In an embodiment, the mechanical cutter follows the scribe created by the laser. In an embodiment, the workpiece is supported by a table. The workpiece moves relative to the laser and the mechanical cutter. In an embodiment, the relative movement of workpiece is at a speed of about 120 mm/sec.

These and other embodiments, aspects, advantages, and features of the present invention will be set forth in part in the description which follows, and in part will become apparent to those skilled in the art by reference to the following description of the invention and referenced drawings or by practice of the invention. The aspects, advantages, and features of the invention are realized and attained by means of the instrumentalities, procedures, and combinations particularly pointed out in the appended claims.

DETAILED DESCRIPTION OF THE EMBODIMENTS

In the following detailed description of the embodiments, reference is made to the accompanying drawings which form a part hereof, and in which is shown by way of illustration specific embodiments in which the inventions may be practiced. These embodiments are described in sufficient detail to enable those skilled in the art to practice the invention, and it is to be understood that other embodiments may be utilized and that process, electrical or mechanical changes may be made without departing from the scope of the present invention. The terms wafer and substrate used in the following description include any base semiconductor structure. Both are to be understood as including silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. The following detailed description is, therefore, not to be taken in a limiting sense, and the scope of the present invention is defined only by the appended claims and their equivalents.

The present description uses a reference number convention of the first digit corresponding to the figure in which the number references and the last two digits corresponding to like elements throughout the description. For example, the laser has a reference number of X10, where X is the number of figure on which the reference number refers.

Figures 1A, 1B:
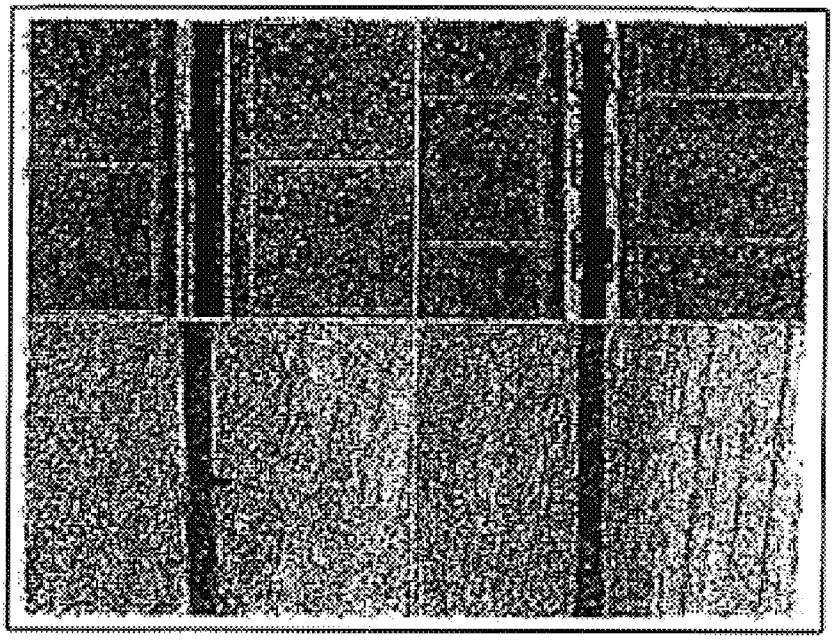
FIGS. 1A and 1B are views of backsides of wafers that are cut using conventional devices and techniques.
Figures 2A, 2B:
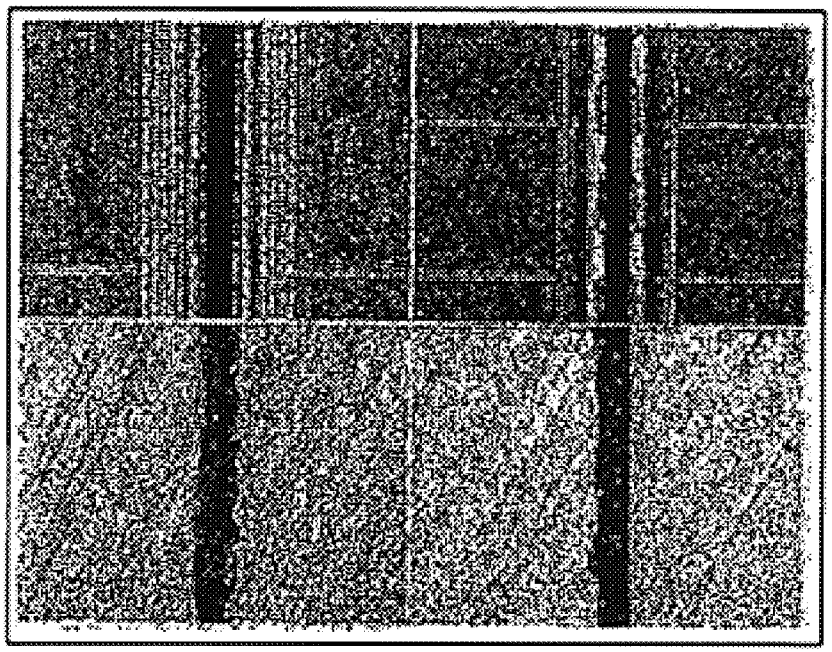
FIGS. 2A and 2B are views of backsides of wafers that are cut using conventional devices and techniques in a two pass cut.
Figure 3:
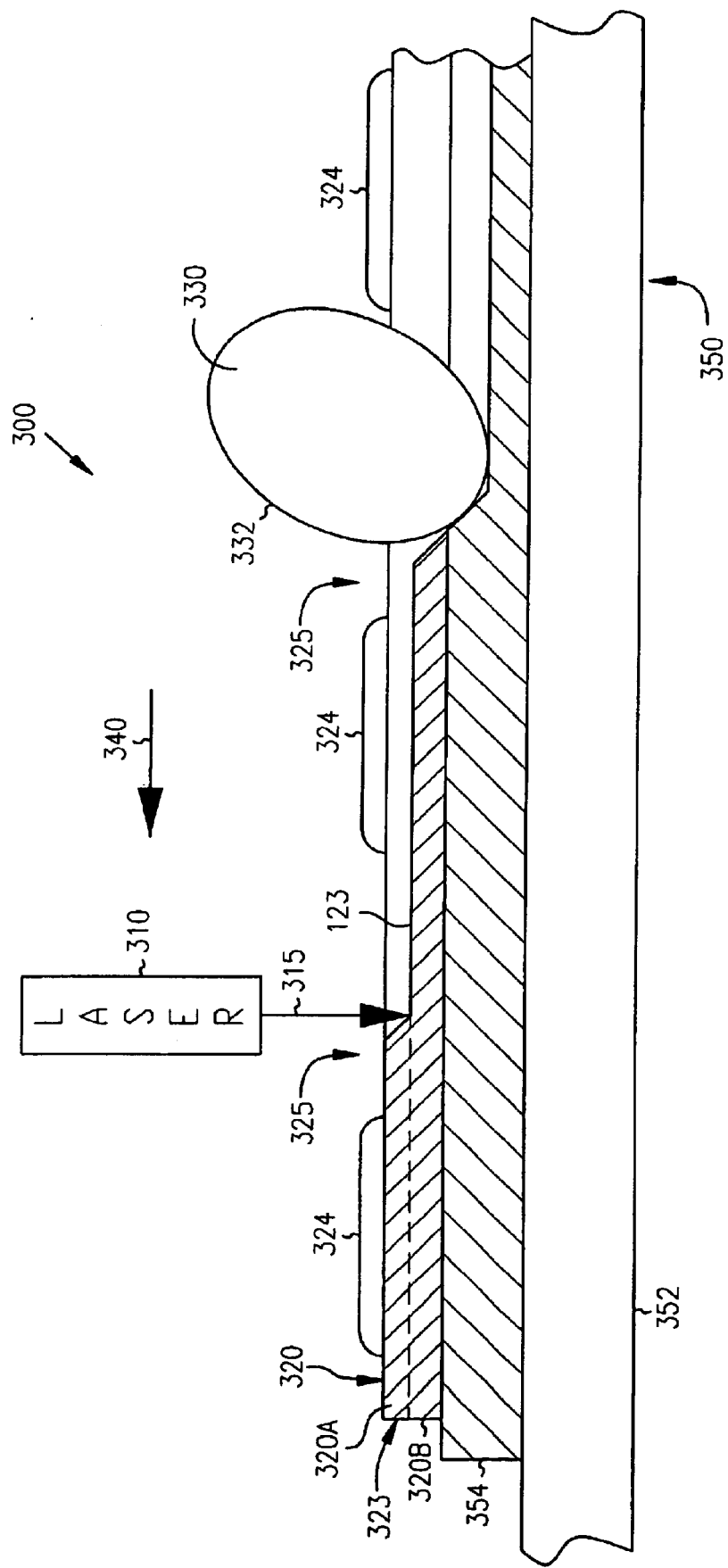
FIG. 3 is a view of a wafer cutting apparatus according to the teachings of the present invention.

FIG. 3 shows a side view of a workpiece cutting apparatus 300 according to an embodiment of the present invention. An embodiment of the present invention is adapted to cut and/or dice workpieces 320 such as wafers, semiconductor substrates and the like. Apparatus 300 includes a laser 310 producing a laser beam 315 that scribes a wafer 320. As used herein, the term "scribe" is defined as partially cutting into a workpiece and not cutting entirely through the workpiece. The apparatus further includes a mechanical cutter 330, e.g., a saw blade, for further cutting into the wafer 320. In an embodiment, saw blade 330 is a circular saw blade having an outer cutting surface 332. In an embodiment, saw blade 330 includes a diamond cutting surface. In an embodiment, saw blade 330 includes a diamond-nickel cutting surface. In an embodiment, the laser 315 and saw blade 330 are fixed together at a fixed distance apart. In an embodiment, the laser 315 and the saw blade 330 move relative to the wafer 320 in the direction of arrow 340 to respectively scribe and cut the wafer 320.

In an embodiment, the workpiece cutting apparatus 300 further includes a workpiece support 350. The workpiece support 350 is adapted to rigidly fix the workpiece such that its position is readily determined and it will not move during scribing or cutting. An embodiment of the support 350 includes table 352 and an adhesive layer 354 on the top surface of the table. The adhesive layer 354 fixes the wafer 320 to the table 352. In an embodiment, the adhesive layer 354 is a tape.

The wafer 320, in an embodiment, includes a substrate layer 323 on which is formed at least one active circuit 324 for each die. In an embodiment, a plurality of active circuits 324 are formed on the substrate layer 323. The active circuits 324 are fabricated according to techniques known to those of skill in the art of semiconductor fabrication. Intermediate the dies are saw streets 325 whereat the laser beam 315 and mechanical cutter 330 can cut into the wafer 320 to dice the wafer into separate dies without damaging the active circuits 324. In an embodiment, the layer 323 is divided into a upper layer 320A and a lower layer 320B. In an embodiment, integrated circuits are formed within the upper layer 320A according to known fabrication techniques. The lower layer 320B is a substrate layer on which integrated circuit layers are fabricated. In an embodiment, lower layer 320B also includes integrated circuit elements.

In a method of operation, the workpiece 320 is diced or separated by first producing a laser beam 315 which ablates an upper portion or layer 320A of the workpiece 320. In an embodiment, laser 315 ablates only a portion of the upper layer 320A. In an embodiment, the laser beam 315 and workpiece 320 move relative to each other such that a continuous channel 322 is formed in the workpiece by the laser beam 315. In an embodiment, the laser beam ablates a top layer 320A of the workpiece. In an embodiment, the laser beam ablates completely through the workpiece 320. In an embodiment where the workpiece 320 is a semiconductor wafer, then the top layer 320A includes a metalization layer. In an embodiment, the top layer 320A includes a passivation layer. In an embodiment, the passivation layer includes a glass. In an embodiment, the passivation layer is an insulator. In an embodiment, the passivation layer includes a polymide. In an embodiment, the polymide is of the formula PIx. In an embodiment, the polymide is PBO. In an embodiment, the passivation layer includes two sub-layers. In an embodiment, the top layer 320A includes test structures such as contacts and circuit elements. After the laser beam 315 ablates an upper portion of the workpiece 320, the mechanical cutter 330 completes the cut through the remaining unablated lower portion or bottom layer 320B of the workpiece 320. In an embodiment, the cutter 330 follows the scribe or channel formed by the laser beam 315. In an embodiment, the upper layer 320A ablated by the laser is the passivation layer only and not levels of the wafer beneath the passivation layer. In an embodiment, the laser 310 and mechanical cutter 330 are supported on separate supports (not shown in FIG. 3). In an embodiment, laser 310 and cutter 330 are movable relative to each other. In an embodiment, the laser 310 scribes the entire wafer 320 before the mechanical cutter 330 begins completes the cut through the wafer 320. In an embodiment, the laser 310 and mechanical cutter 330 are fixed to a same support. In an embodiment, the mechanical cutter 330 follows directly after the laser 310 at a fixed distance.

Figure 4:
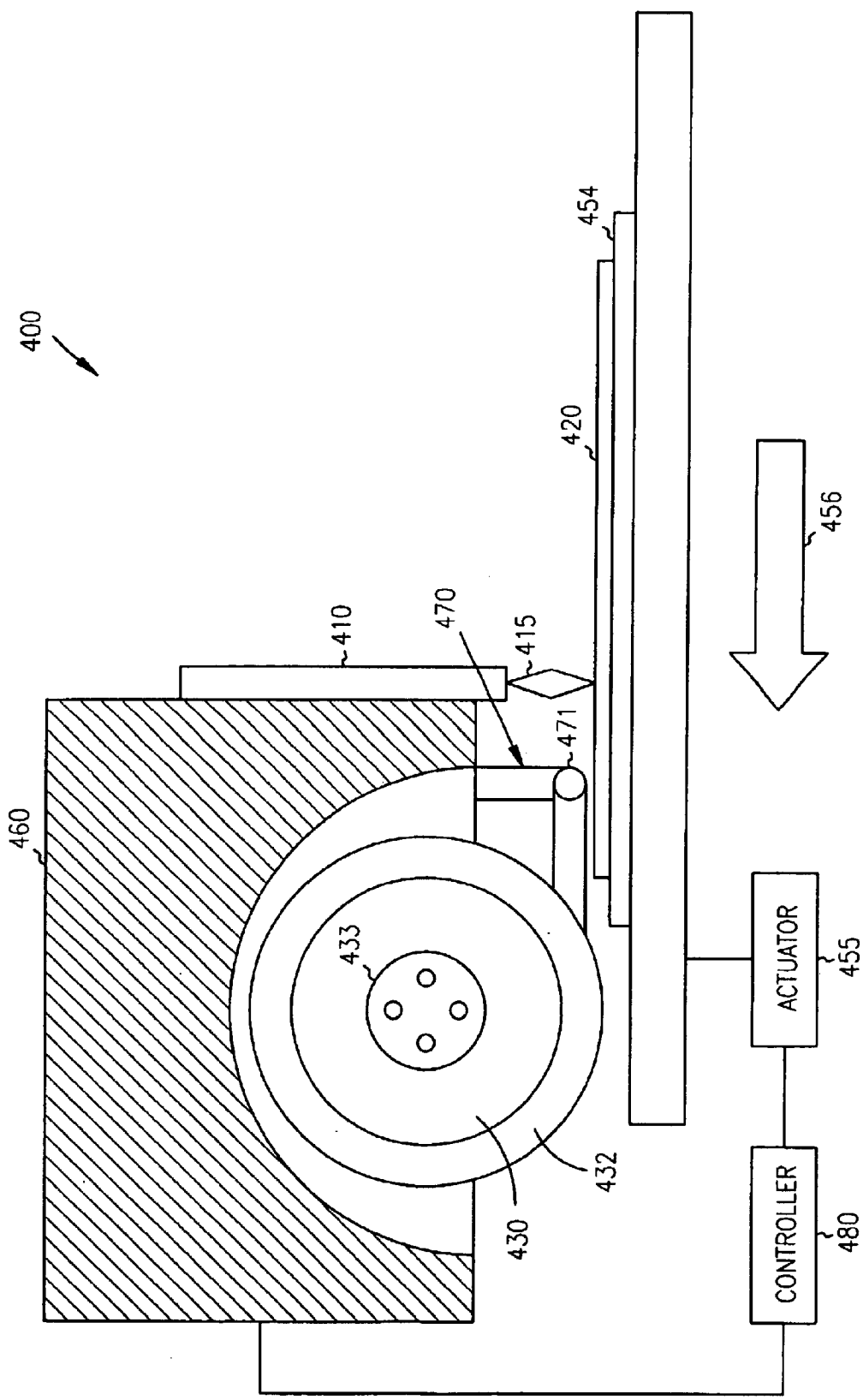
FIG. 4 is a view of a wafer cutting apparatus according to the teachings of an embodiment of the present invention.

FIG. 4 shows an embodiment of a workpiece cutting apparatus 400 according to the teachings of the present invention. Workpiece cutting apparatus 400 includes a laser 410 and a mechanical cutter 430 each fixed to a housing 460. The laser 410 produces a laser beam 415 for cutting a workpiece 420 such as a wafer or semiconductor substrate. In an embodiment, the mechanical cutter 430 includes a circular saw blade 432. In an embodiment, the housing 460 is fixed and a workpiece support unit 450 is positioned adjacent the housing. In an embodiment, the workpiece support unit 450 includes a table 452 on which is positioned an attachment device 454 that fixes a workpiece 420 to the table. Workpiece support unit 450 further includes an actuator 455 that is connected to the table 452. Actuator 455 moves the table relative to the fixed housing 450, and hence the laser 410 and mechanical cutter 430, during a cutting operation. The actuator 455, in an embodiment, includes stepper motors that precisely control the position of table 452. Actuator 455 may include pneumatic or hydraulic devices for precisely positioning the table 452. The actuator 455 is capable of moving the table 452 and workpiece 420 in the direction indicated by arrow 456. Accordingly, laser beam 415 produced by laser 410 ablates material from the workpiece 420 before the mechanical cutter 430 cuts the workpiece 420. In an embodiment, the actuator 455 can rotate the table 452 such that both the X and Y directions of the workpiece 420 are cut by the laser 410 and mechanical cutter 430.

Housing 460 provides a support for the mechanical cutter 430 and the laser 410. The housing 460, in an embodiment, holds the motor (not shown) driving a rotor 433 to which the mechanical cutting blade, e.g., the circular saw blade 432, is fixed. Laser 410 is mounted on the front (right in FIG. 4) face of the housing 460. The front face is the lead, initial surface of the housing that the workpiece passes when it is moved the the direction 456. In an embodiment, housing 460 includes a cooling unit 470. Cooling unit 470 includes a coolant source (not shown) that is connected to housing 460 and fluidly connected to a slide bar nozzle assembly 471. Slide bar nozzle assembly 471 is positioned intermediate the laser 410 and mechanical cutter 430. Thus, coolant exits the slide bar nozzle assembly 470 intermediate the laser 410 and cutter 430 to reduce the effects of temperature on the workpiece during a cutting operation. It will be understood that the housing 460 is adaptable for use with embodiments of the present invention described herein.

Controller 480 is electrically connected to the actuator 455, laser 410 and cutter 430. In an embodiment, controller 480 is further connected to cooling unit 470. Accordingly, controller 480 controls and coordinates operation of each of these elements. Controller 480, in an embodiment, is a computer having a processor and memory. As know to one of ordinary skill in the art, the memory stores data and instructions that are used by the processor to produce control signals for the devices connected to the controller. The memory includes any machine readable data storage device. Examples of the memory include solid state memory chips such as RAM, DRAM SRAM, SDRAM, and other memory chips known in the art. The memory further includes magnetic and optical storage devices, such as disks, tapes, CD-ROM, and other storage devices known on the art.

In an embodiment, the controller 480 provides signals to the laser 410 that regulate the timing, power and refresh frequency of the laser 410. In an embodiment, controller 480 provides signals controlling movement of the laser housing 450 and, hence, movement of the laser and housing. In an embodiment, the controller 480 provides signals to the mechanical cutter 430 that regulate operation of cutter 430, such as the speed of the cutting blade. Controller 480 further provides signals to the actuator 455 to regulate movement of the table 452 and, hence, the position of the workpiece 420 relative to the laser beam 415. Accordingly, the controller 480 governs operation of the laser 410 in conjunction with movement of the workpiece 420 such that the minimal energy needed to ablate the workpiece material is applied at the correct location of the workpiece. As a result, the potential for collateral damage to the workpiece is reduced.

Figure 5:
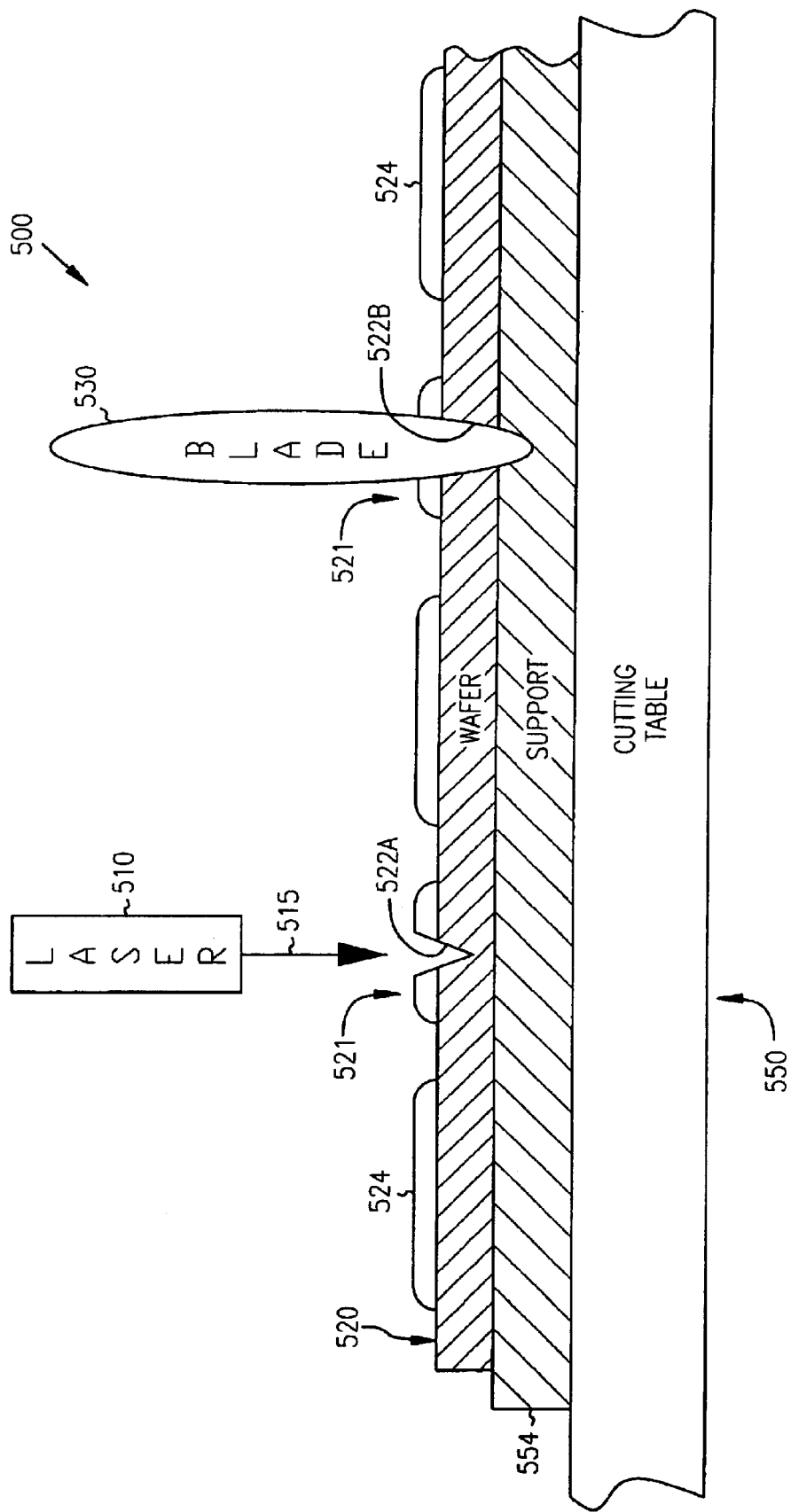
FIG. 5 is a view of a wafer cutting apparatus according to the teachings of an embodiment of the present invention.

FIG. 5 shows an end view of a workpiece cutting apparatus 500 according to an embodiment of the present invention. Apparatus 500 includes a laser 510 producing a laser beam 515 and a mechanical cutter 530. Laser 510 produces a laser beam 515 that scribes the workpiece 520 in a saw street 521 intermediate active circuits 524 to create a trench 522A in upper portion of the wafer workpiece. It is understood that it is within the scope of the present invention to position the active circuits with the wafer workpiece 520. In an embodiment, the laser beam 515 cuts into the top layer on a wafer workpiece. In an embodiment, the laser beam 515 cuts through the top layer on a wafer workpiece. In an embodiment, the top layer is a polymide. Mechanical cutter 530 cuts through the remaining portion of the workpiece in previously formed trench. The mechanical cutter 530, in an embodiment, cuts into a portion of the support 554 fixing the workpiece to the table 550. In an embodiment, the mechanical cutter 530 is not aligned with the laser 510. Accordingly, the laser 510 and mechanical cutter 530 maybe positioned at separate workstations. The laser 510 and mechanical cutter 530 may be positioned in the same workstation but supported on independent arms controlled by a controller.

Figure 6:
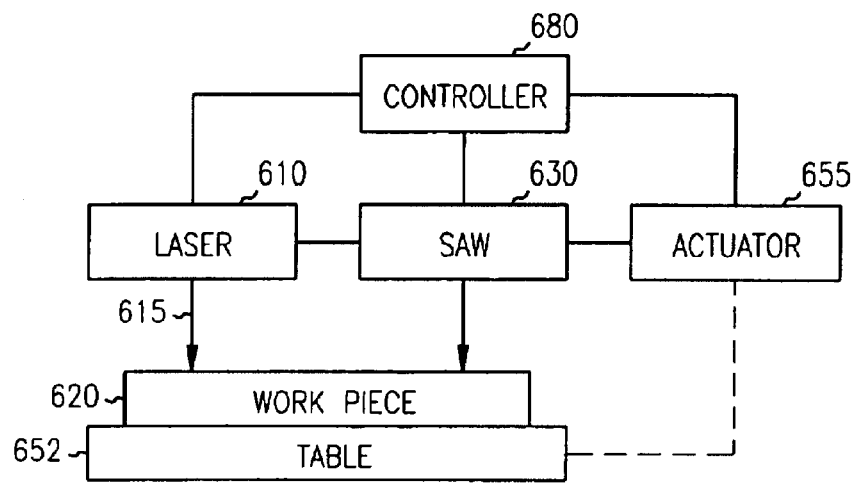
FIG. 6 is diagrammatic view of a system according to the teachings of the present invention.

FIG. 6 shows a system 600 for cutting workpieces 620 according to the teachings of the present invention. System 600 includes a controller 680 capable of communicating with the laser 610, mechanical cutter 630, and actuators 655. Controller 680 regulates operation of these devices according to the teachings of the present invention. Laser 610 and cutter 630 are adapted to scribe and/or cut the workpiece 620 accordingly to the teachings of the present invention. In an embodiment, actuator 655 is connected to the laser 610 and the mechanical cutter 630 to control the movement thereof. In an embodiment, actuator 655 is connected to the table 652 to control movement of the workpiece 620 fixed to the table 652. The present invention thus provides for relative movement between the laser 610 and workpiece 620 as well as between mechanical cutter 630 and workpiece 620. In an embodiment, controller 680 separately controls the laser 610 and cutter 630 such that one can engage workpiece 620 without the other being activated. Accordingly, the laser 610 can scribe and/or cut the workpiece 620 without the cutter 630 by activation of only the laser 610 by controller 680. If it is determined that the laser 610 is not necessary for cutting and/or scribing a workpiece, then the controller 680 activates cutter 630 and does not activate laser 610. Accordingly, only cutter 630 engages the workpiece 620.

Figure 7:
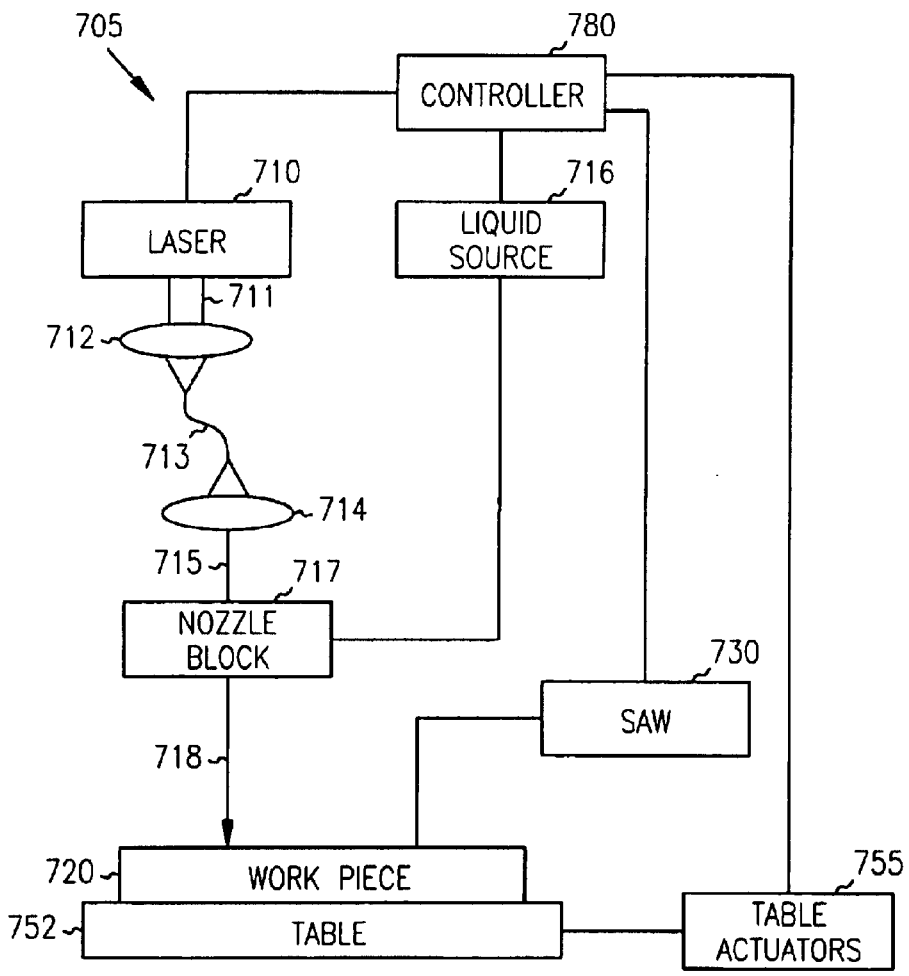
FIG. 7 is diagrammatic view of a system according to the teachings of the present invention.

FIG. 7 shows a system 700 for cutting and or dicing a workpiece 720. Workpiece 720 is fixed to a table 752, which is moved relative to laser assembly 705 and mechanical cutter 730 by actuators 755 based on control signals received from controller 780. Laser assembly 705 includes a laser 710 and a liquid source 716. Laser 710 produces an unfocused laser beam 711 directed to a focusing unit 712. Beam guide 713 receives the focused beam from the focusing unit 712. Beam guide 713 projects the beam on a collimator unit 714. Collimator unit 714 projects the beam into a nozzle block 717. Nozzle block 717 is fluidly connected to the liquid source 716. The nozzle block 717 creates a liquid and laser beam combination 718. This combination 718 is directed to the workpiece 720 to scribe and/or cut it. In an embodiment, a controller 780 is connected to the laser assembly 705, mechanical cutter 730 and actuator 755. Controller 780 controls and coordinates operation of these elements according to the teachings of the present invention.

The liquid source 716, in an embodiment, provides a liquid stream that acts as a guide directing the laser beam to the workpiece 720. In an embodiment, the liquid stream has a diameter equal to the laser beam diameter. In an embodiment, the liquid stream diameter is about 50 micrometers to about 150 micrometers. In an embodiment, the liquid is water. The water, when guiding a laser beam to a wafer workpiece, is filtered to a high degree such that particles that can damage the wafer workpiece are not present. In an embodiment, the water is filtered to remove particles of at 0.2 microns and greater. Moreover, the liquid should be electrically neutral. Accordingly, the liquid is deionized.

Figure 8:
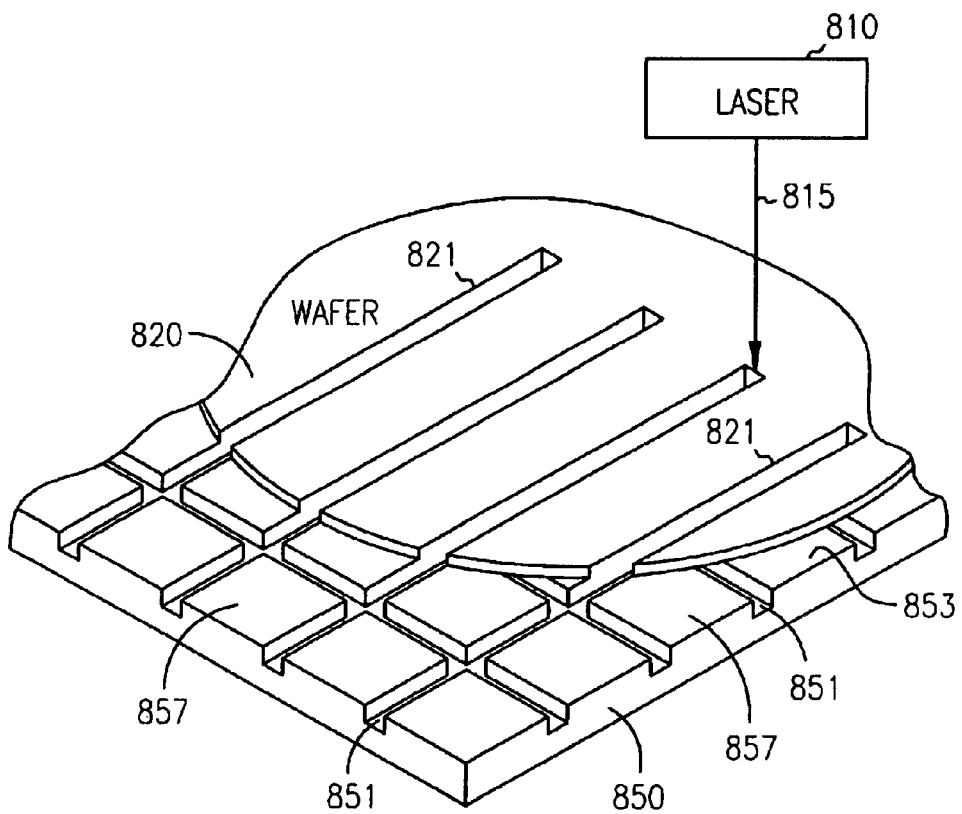
FIG. 8 is an enlarged, partial view of a wafer support and laser according to an embodiment of the present invention.

FIG. 8 shows an embodiment of a workpiece support table 850 according to the teachings of the present invention. Table 850 includes reliefs 851 in the form of channels recessed into the table below a workpiece supporting surface 853. Workpiece support surface 853 is defined by coplanar top surfaces of columns 857. In an embodiment, the table includes an attachment layer (not shown) for holding the workpiece 820 on the top surface of the columns 857. In an embodiment, the workpiece 820 is a wafer or semiconductor substrate. In an embodiment, workpiece 820 includes saw streets 821 extending in at least one direction. The saw streets 821 are aligned with reliefs 851 when the workpiece is fixed to the table 850. In an embodiment, the laser 810 scribes the workpiece 820. In use, the laser 810 produces a laser beam 815 which cuts the workpiece 820 along saw streets in the workpiece that are aligned with the reliefs 851. In an embodiment, the laser 810 is a liquid guided laser and the reliefs 851 receive the liquid and channel it away from the workpiece. In an embodiment, the reliefs 851 provide coolant to the workpiece to reduce the effects of heat produced by the laser beam 815 on the workpiece 820. A wafer workpiece 820 is sensitive to temperature effects which could damage circuitry on the wafer workpiece. As known to one of ordinary skill each wafer has a limited thermal budget, which if exceeded causes defects in the circuitry. Moreover, elements in the wafer workpiece may have low breakdown temperatures. For example, copper and aluminum have relative low melting points compared to other metals. A laser may heat such elements to such an extent that they undesirably reflow. Such reflow may increase resistance and open interconnect lines. Moreover, excess heat may result in undesirable diffusions from one layer to another layer in the circuitry formed on the wafer workpiece.

The lasers 310, 410, 510, 610, 710, or 810 described herein include any laser suitable for scoring and/or cutting through a workpiece. In an embodiment, the laser is adapted for cutting wafer structures fabricated according to known techniques. In an embodiment, the laser is a solid state laser. In an embodiment, the laser is a yttrium-aluminum-garnet (YAG) laser. In an embodiment, the laser is a neodymium-YAG laser. The laser wavelength, in an embodiment, is about 1 micrometer. In an embodiment, the laser power is about 300 watts. In an embodiment, the laser power is less than about 300 watts. In an embodiment, the laser power is greater than about 100 watts. In an embodiment, the laser refresh rate is about 3,000 Hz. In an embodiment, the laser refresh rate is less than about 3,000 Hz. In an embodiment, the laser refresh rate is greater than 1,000 Hz. In an embodiment, the laser is an excimer laser. The laser is desirable for use in scribing or cutting the workpiece as it does not apply mechanical stress onto the workpiece. In an embodiment, the laser is used to completely cut through, e.g., dice, a wafer. In an embodiment, the laser scribes the wafer. Thereafter, the wafer is divided into individual dies. In an embodiment, a mechanical cutter follows the scribes formed by the laser. The mechanical cutter, during a cutting operation, does not contact or engage the top surface of the wafer as the top surface was removed by the laser. In an embodiment, the wafer is broken into individual dies along the scribes created by the laser.

Figure 9:
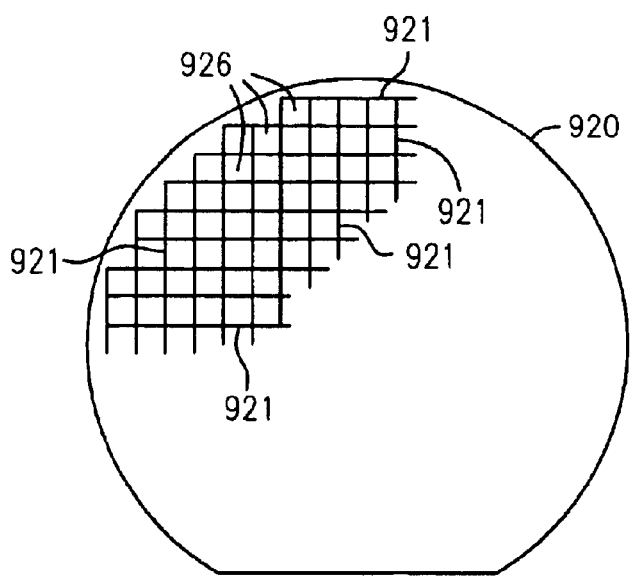
FIG. 9 is a view of a wafer including a plurality of dies separated by saw streets.

FIG. 9 shows a wafer 920 that includes a plurality of dies 926 integrally connected by saw streets 921. In an embodiment, the wafer 920 has a thickness of about 300 micrometers. In an embodiment, the wafer 920 has a thickness of about 305 micrometers. In an embodiment, the wafer 920 has a thickness of about 470 micrometers. In an embodiment, the wafer 920 has a thickness of about 500 micrometers. In an embodiment, the saw streets 921 in one group extend parallel to each other. In an embodiment, saw streets 921 are equally spaced from each other. Saw streets 921 in one group extend perpendicular to saw streets in a second group. The wafer 920 includes a base layer on which is formed a plurality of integrated circuit layers to form integrated circuits. The layers include capacitors, transistor, lines, plugs, fill, insulators, wells, metals, and other structures known in the field of integrated circuits. Each die 926 includes at least one integrated circuit element. The dies 926 are separated from each other according to the teachings of the present invention. Individual dies 926 may represent a complete integrated circuit such as a processor, memory chip, or other integrated circuit. Memory chip dies include DRAM, SRAM, SDRAM, and other chips known in the art. The saw streets 921 typically do not contain circuit elements. In an embodiment, at least one saw street includes contacts. The contacts provide electrical connection between the integrated circuits on the die and circuits outside the die. The present description provides examples of various wafers that can be used in the present invention. Thus, these examples do not limited the present invention unless expressed in the appended claims.

A process according to the teachings of the present invention includes cutting into a workpiece 320, 420, 520, 620, 720, 820, or 920 using a laser 310, 410, 510, 610, 710, or 810. The laser removes material from a top portion of a workpiece to create a scribe. In an embodiment, the scribe extends along a saw street of a wafer workpiece. In an embodiment, a mechanical cutter 330, 430, 530, or 730 cuts the wafer workpiece at the scribe. Accordingly, the cutter completes the cut through the remaining portion of the wafer beneath the scribe created by the laser. The cutter completes the cut through the wafer workpiece, thereby separating adjacent dies. In an embodiment, the laser completes a scribe throughout the length of the saw street prior to the cutter engaging the wafer workpiece. In an embodiment, both the laser and the cutter act on the wafer workpiece at the same time. In an embodiment, the cutter closely follows the laser such that both the laser and the cutter are simultaneously engaging a same saw street.

In an embodiment, it is desirable to maintain a processing speed of 120 mm/sec when dicing a wafer. The use of a two pass cutting process according to the teachings of the present invention maintains such a speed. Both the laser and the mechanical cutter can engage, e.g., ablate and cut, a wafer at this speed. The speed need not be reduced as when using conventional techniques for cutting wafers having a thickness of greater than 100 micrometers. The laser can scribe a channel in the wafer. The mechanical cutter follows the channel and completes a cut through the wafer. In an embodiment where the wafer has a top layer on the saw street in the range of about 25 micrometers to about 50 micrometers, the laser creates a channel at least as deep as the top layer. Thus, the channel has a depth in a range of about 25 micrometers to about 50 micrometers in this example. In an embodiment, the channel has a depth deeper than about 25 micrometers to about 50 micrometers. In an embodiment, the feed speed of the wafer is about 120 mm/sec.

Accordingly, the feed speed of the wafer is not reduced based on the thickness of the wafer or the top layer of the wafer.

In an embodiment, the two pass cutting process of the present invention improves backside chipping and backside cracking over a single pass cutting process at least the same as the two pass cut listed in Table 1. In an embodiment, the two pass cut of first scribing with a laser and then cutting with a mechanical cutter results in a faster cutting speed than the two pass mechanical cut process described in conjunction with Table 1.

In an embodiment, the controller 480, 680, or 780 includes software that generates control instructions for the wafer workpiece dicing equipment. The instructions control the relative movement of the wafer workpiece 320, 420, 520, 620, 720, 820, or 920 as compared to the cutting equipment such as laser 310, 410, 510, 610, 710, or 810 and mechanical cutter 330, 430, 530, or 730. In an embodiment, the speed at which the wafer workpiece moves relative to the laser is about 120 millimeters per second. In an embodiment, the software determines the use of the laser and/or the mechanical cutter based on the thickness and composition of the wafer workpiece. For example, if the wafer workpiece is ultrathin, then only the laser is used to cut through the wafer workpiece. In an embodiment, if the wafer workpiece has no, or a very thin polymide coating on the saw street, then the mechanical cutter is used without the laser.

The present invention also cuts through ultrathin wafers. Ultrathin wafers have a thickness through which the laser 310, 410, 510, 610, 710, or 810 will completely cut through of about 100 micrometers. In an embodiment, the wafer thickness is less than 100 micrometers. In an embodiment, the thickness of about 5 mils. In an embodiment, the thickness of less than about 5 mils. In an embodiment, the thickness of about 4 mils. In an embodiment, the thickness of less than about 5 mils. In an embodiment, the feed speed of the wafer relative to the laser is about 120 millimeters per second. In an embodiment, the laser has an average output power of about 300 watts. In an embodiment, the laser has a refresh rate of about 3000 Hz. In an embodiment, the laser has a maximum refresh rate of 3000 Hz. Accordingly, the present invention provides for dicing ultrathin wafer workpieces using only the laser.

Conclusion

The present invention provides improved workpiece cutting structures and processes. The laser scribes a workpiece in a relatively stress-free as compared to mechanical cutters such as saws, scribers, and mechanical separators . A mechanical cutter, such as a saw blade, follows the laser in the scribe created by the laser in an embodiment of the invention. The speed at which the laser and cutter act on the workpiece is maintained at about 120 mm/sec. to provide adequate throughput. Accordingly, productivity is not diminished. The use of the laser as the first pass in a two pass cutting procedure reduces damage to the workpiece such as surface chipping and backside fragmentation. Accordingly, fewer wafer workpieces are damaged during dicing.

The present invention also provides a laser devices and method for cutting wafer workpieces without a mechanical cutter. The laser is adapted to cut through very thin workpieces. The workpieces have thickness as described herein. Accordingly, there is no mechanical stress on the very thin workpieces, which can cause a significant amount of cracking and chipping particularly in semiconductor wafers.

Although specific embodiments have been illustrated and described herein, it will be appreciated by those of ordinary skill in the art that any arrangement which is calculated to achieve the same purpose may be substituted for the specific embodiments shown. Many adaptations of the invention will be apparent to those of ordinary skill in the art. For example, other integrated circuit processing equipment may be utilized in conjunction with the invention. Accordingly, this application is intended to cover any adaptations or variations of the invention. It is manifestly intended that this invention be limited only by the following claims and equivalents thereof.

The invention claimed is:

1. A wafer dicing device, comprising:
    a laser adapted to scribe a wafer; and
    a cutting blade following the laser and engaging a same saw street in the wafer as the laser.
2. The device of claim 1, wherein the cutting blade completes a cut through a wafer.
3. The device of claim 1, wherein the cutting blade includes a nickel-diamond cutting surface.
4. The device of claim 1, wherein the cutting blade is a circular blade.
5. The device of claim 1, wherein the laser includes a liquid guided laser beam.
6. The device of claim 5, wherein the liquid guided laser beam includes water.
7. An integrated circuit substrate cutting device, comprising:
    a laser adapted to scribe a wafer; and
    a cutting blade adapted to follow the laser at a fixed distance and to simultaneously cut the substrate with the laser scribes ahead of the cutting blade.
8. The device of claim 7, wherein the cutting blade completes a cut through a substrate.
9. The device of claim 7, wherein the cutting blade includes a nickel-diamond cutting surface on a circular blade.
10. The device of claim 7, wherein the laser includes a liquid guided laser beam.

11. The device of claim 7, wherein the liquid guided laser beam includes water.

12. A device for dicing a wafer having a saw street, comprising:
a laser adapted to scribe a wafer along a saw street; and
a mechanical cutter following the laser along a scribe in the same saw street being scribed by the laser.

13. The device of claim 12, wherein the mechanical cutter is aligned with the laser in a direction of the saw street.

14. The device of claim 12, wherein the mechanical cutter completes a cut through a wafer.

15. The device of claim 12, wherein the mechanical cutter includes a nickel-diamond cutting surface and is a circular blade.

16. A wafer dicing device, comprising:
a laser adapted to form a scribe in a wafer, wherein the laser has an average power of about 300 watts; and
a mechanical cutter following the laser and engaging the wafer at the scribe.

17. The device of claim 16, wherein the mechanical cutter completes a cut through a wafer at the scribe formed by the laser.

18. The device of claim 16, wherein the laser includes a liquid guided laser beam.

19. A wafer dicing device, comprising:
a laser adapted to form a scribe in a wafer, wherein the laser has an average power of less than about 300 watts; and
a cutting blade following the laser and engaging the wafer at the scribe.

20. The device of claim 19, wherein the laser includes a water guided laser beam.

21. A wafer dicing device, comprising:
a laser adapted to form a scribe in a wafer, wherein the laser has an refresh rate of about 3000 Hz; and
a mechanical cutter following the laser and cutting the wafer at the scribe.

22. The device of claim 21, wherein the mechanical cutter includes cutting blade that completes a cut through the wafer at the scribe.

23. The device of claim 22, wherein the cutting blade includes a nickel-diamond cutting surface on a circular blade.

24. The device of claim 21, wherein the laser includes a liquid guided laser beam.

25. A wafer dicing device, comprising:
a laser adapted to form a scribe in a wafer, wherein the laser has an refresh rate of less than about 3000 Hz; and
a cutting blade following the laser along the scribe in the wafer created by the laser.

26. The device of claim 25, wherein the laser includes a liquid guided laser beam.

27. The device of claim 25, wherein the laser is a yttrium-aluminum-garnet (YAG) laser.

28. The device of claim 25, wherein the laser is a neodymium yttrium-aluminum-garnet (Nd: YAG) laser.

29. A device for dicing a wafer having a metalization layer, comprising:
a laser adapted to cut the metalization layer of the wafer; and
a mechanical cutter following the laser and completing a cut through the wafer.

30. The device of claim 29, wherein the laser only cuts through the metalization layer.

31. The device of claim 29, wherein the laser only cuts partially into the metalization layer.

32. The device of claim 29, wherein the cutting blade creates a kerf through the wafer, the kerf having a width essentially equal to a cut made by the laser.

33. The device of claim 29, wherein the cutting blade creates a kerf through the wafer, the kerf having a width larger than a cut made by the laser.

34. A device for dicing a wafer having a test layer, comprising:
a laser adapted to cut a kerf in the test layer of the wafer; and
a mechanical cutter adapted to follow the laser at a fixed distance and to cut the wafer along the kerf.

35. The device of claim 34, wherein the laser only cuts through the test layer.

36. The device of claim 34, wherein the laser only partially cuts the test layer such that the kerf is only in the test layer.

37. The device of claim 34, wherein the mechanical cutter includes a cutting blade having a nickel-diamond cutting surface.

38. The device of claim 34, wherein the laser includes a liquid guided laser beam.

39. A wafer dicing device, comprising:
a laser adapted to ablate a saw street in a wafer to form a scribe;
a mechanical cutter following the laser; and
a wafer support movable relative to the laser and the mechanical cutter.

40. The device of claim 39, wherein the wafer support is movable in a direction of the saw street in the wafer supported on the wafer support.

41. The device of claim 39, wherein the wafer support includes actuators that move the wafer past at least one of the laser and the mechanical cutter at a rate of about 120 millimeters per second.

42. The device of claim 39, wherein the mechanical cutter completes a cut through a wafer along the scribe created by the laser.

43. The device of claim 39, wherein the wafer support includes a table and an adhesive layer fixing the wafer on the table.

44. The device of claim 43, wherein the adhesive layer is a tape.

45. The device of claim 43, wherein the adhesive layer is a soluble glue, which is removable from at least one of the wafer and the table by an agent.

46. A wafer dicing device, comprising:
a laser adapted to form a scribe in a wafer;
a mechanical cutter following the laser and cutting the wafer along the scribe; and
a wafer support movable relative to the laser and the mechanical cutter, wherein the wafer support includes reliefs therein.

47. The device of claim 46, wherein the reliefs are aligned with saw streets of the wafer supported on the wafer support.

48. The device of claim 46, wherein the wafer support is movable in a direction of a saw street in a wafer supported on the wafer support.

49. The device of claim 46, wherein the mechanical cutter includes a blade that completes a cut through a wafer.

50. The device of claim 49, wherein the blade includes a nickel-diamond cutting surface on a circular blade.

51. The device of claim 46, wherein the laser includes a liquid guided laser beam.

52. The device of claim 51, wherein the reliefs receive liquid from the liquid guided laser beam and channel the liquid away from the wafer.

53. A device for dicing a wafer having a thickness of less than about 100 micrometers, comprising:
  a wafer support; and
  a laser having an output of about 300 watts and a maximum refresh rate of about 3000 Hz, wherein the laser is adapted to completely cut through the wafer.

54. The device of claim 53, wherein the wafer has a thickness of less than about five millimeters.

55. The device of claim 53, wherein the laser is a liquid guided laser.

56. The device of claim 29, wherein the mechanical cutter follows the laser at a fixed distance such that the laser and mechanical cutter simultaneously engage a same saw street.

57. The device of claim 29, wherein the laser and mechanical cutter are adapted to move relative to the wafer at about 120 mm/sec.

58. The device of claim 34, wherein the mechanical cutter is adapted to simultaneously engage a same saw street in the wafer as the laser.

* * * * *